United States Patent
Kamei et al.

(10) Patent No.: US 8,853,551 B2
(45) Date of Patent: Oct. 7, 2014

(54) WIRED CIRCUIT BOARD AND PRODUCING METHOD THEREOF

(75) Inventors: Katsutoshi Kamei, Osaka (JP); Yuu Sugimoto, Osaka (JP); Kimihide Kitamura, Osaka (JP)

(73) Assignee: Nitto Denko Corporation, Osaka (JP)

( * ) Notice: Subject to any disclaimer, the term of this patent is extended or adjusted under 35 U.S.C. 154(b) by 74 days.

(21) Appl. No.: 13/067,149

(22) Filed: May 12, 2011

(65) Prior Publication Data
US 2011/0284274 A1 Nov. 24, 2011

(30) Foreign Application Priority Data
May 21, 2010 (JP) ................................ 2010-117819

(51) Int. Cl.
*H05K 1/03* (2006.01)
*H05K 1/00* (2006.01)
*H05K 1/09* (2006.01)
*H05K 1/11* (2006.01)
*H05K 1/14* (2006.01)

(52) U.S. Cl.
CPC ........ *H05K 1/118* (2013.01); *H05K 2201/0338* (2013.01); *H05K 1/147* (2013.01)
USPC .............. 174/255; 174/250; 174/257; 29/850

(58) Field of Classification Search
CPC H05K 1/118; H05K 1/147; H05K 2201/0338
USPC .............................. 174/250, 255, 257; 29/850
See application file for complete search history.

(56) References Cited

U.S. PATENT DOCUMENTS

| | | | | |
|---|---|---|---|---|
| 5,047,895 A | * | 9/1991 | Sasaki | 361/749 |
| 5,407,557 A | * | 4/1995 | Iida et al. | 205/125 |
| 5,441,814 A | * | 8/1995 | Gunji et al. | 428/457 |
| 5,483,401 A | * | 1/1996 | Nakajima et al. | 360/281.7 |
| 2002/0078553 A1 | * | 6/2002 | Sato | 29/603.15 |
| 2005/0263320 A1 | * | 12/2005 | Igarashi et al. | 174/255 |
| 2005/0263905 A1 | * | 12/2005 | Usul et al. | 257/774 |
| 2006/0023435 A1 | | 2/2006 | Ooyabu et al. | |
| 2006/0118330 A1 | * | 6/2006 | Ooyabu et al. | 174/261 |

(Continued)

FOREIGN PATENT DOCUMENTS

| | | |
|---|---|---|
| JP | 52-072342 | 6/1977 |
| JP | 6-081161 | 3/1994 |

(Continued)

*Primary Examiner* — Timothy Thompson
*Assistant Examiner* — Rhadames J Alonzo Miller
(74) *Attorney, Agent, or Firm* — Jean C. Edwards, Esq.; Edwards Neils PLLC

(57) ABSTRACT

A wired circuit board includes an insulating layer, and a first conductive pattern and a second conductive pattern formed on the insulating layer. The first conductive pattern includes a first outer terminal on which a metal plating layer is provided, a first inner terminal to be solder connected, and a first wire which connects the first outer terminal and the first inner terminal. The second conductive pattern includes a second outer terminal to be solder connected, a second inner terminal to be solder connected, and a second wire which connects the second outer terminal and the second inner terminal. The first inner terminal and the second inner terminal are arranged in opposed relation with each other so as to be solder connected to the common electric component and preflux processing is performed thereon, and a metal plating layer is provided on the second wire.

9 Claims, 4 Drawing Sheets

(56) References Cited

U.S. PATENT DOCUMENTS

2007/0218781 A1* 9/2007 Yokai et al. ............ 439/752
2009/0061660 A1* 3/2009 Honjo .................... 439/78
2010/0188779 A1* 7/2010 Ohsawa et al. ......... 360/246.1

FOREIGN PATENT DOCUMENTS

| JP | 9-291372 | 11/1997 |
|---|---|---|
| JP | 2005101041 | 4/2005 |
| JP | 2006-040414 | 2/2006 |

* cited by examiner

FIG.3
(a) 
(b) 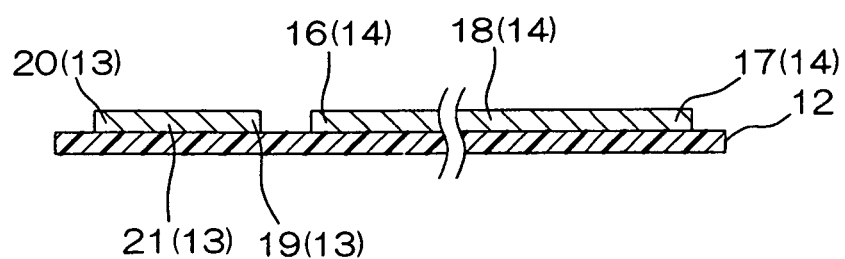
(c) 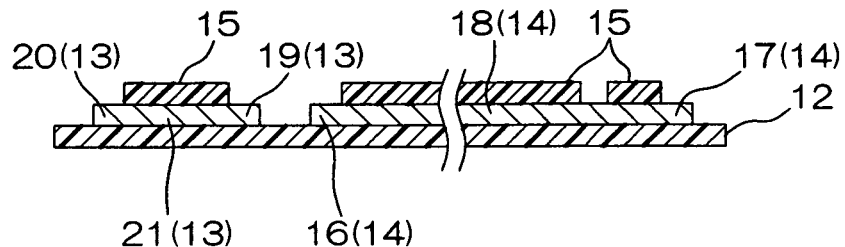
(d) 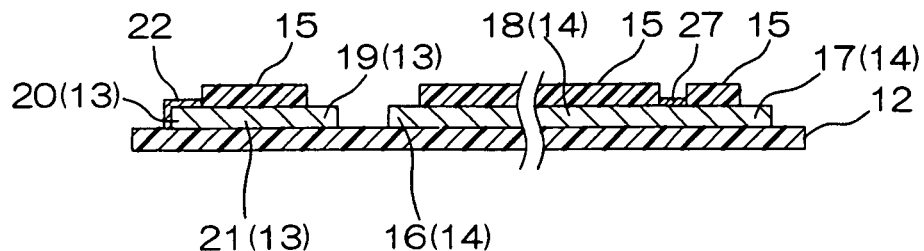
(e) 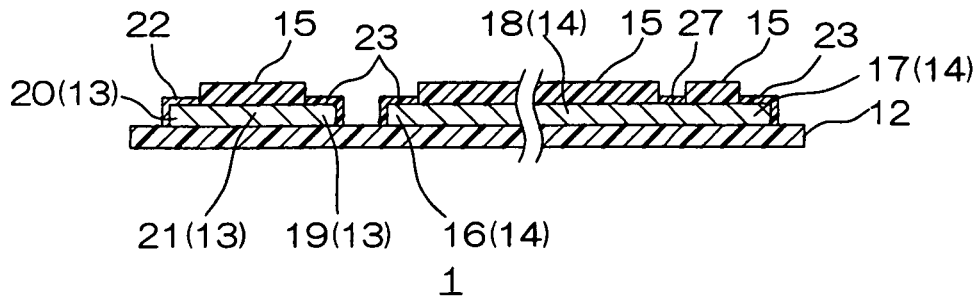

FIG.4
(a) 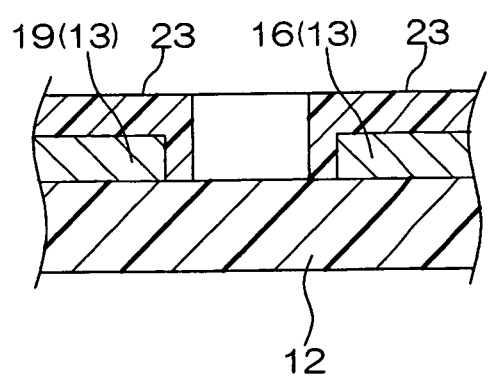
(b) 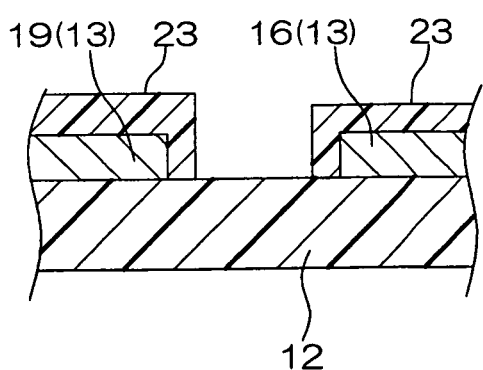

WIRED CIRCUIT BOARD AND PRODUCING METHOD THEREOF

CROSS-REFERENCE TO RELATED APPLICATION

The present application claims priority from Japanese Patent Application No. 2010-117819 filed on May 21, 2010, the contents of which are herein incorporated by reference into this application.

BACKGROUND OF THE INVENTION

1. Field of the Invention

The present invention relates to a wired circuit board and a producing method thereof. More particularly, the present invention relates to a wired circuit board for relaying a suspension board mounted with a magnetic head to a control board which operates a magnetic head, and a producing method thereof.

2. Description of Related Art

Conventionally, a wired circuit board for relaying a suspension board mounted with a magnetic head to a control device which controls the magnetic head has been provided in a hard disk drive.

As the wired circuit board, for example, a control circuit board which includes at one end portion in the lengthwise direction thereof, suspension board terminal portions connected to control circuit board terminal portions of a suspension board with circuit; at the other end portion in the lengthwise direction thereof, external terminal portions connected to various control devices; and at a location near one end portion in the lengthwise direction thereof, preamplifier terminal portions electrically connected to the suspension board terminal portions and preamplifier terminal portions electrically connected to the external terminal portions has been known (cf. Japanese Unexamined Patent Publication No. 2006-40414).

In the control circuit board, the preamplifier terminal portions connected to the suspension board terminal portions and the preamplifier terminal portions connected to the external terminal portions are spaced in opposed relation to each other in the lengthwise direction thereof. One preamplifier IC is connected to the preamplifier terminal portions connected to the suspension board terminal portions, and is connected to the preamplifier terminal portions connected to the external terminal portions so as to extend over them.

SUMMARY OF THE INVENTION

However, in the wired circuit board, while a gold plating layer is usually provided on the suspension board terminal portions for connecting to the suspension board, various control devices are solder connected in the external terminal portions. Each of the preamplifier terminal portions is solder connected to a preamplifier.

Further, preflux processing is performed on each of the preamplifier terminal portions in order to perform solder connection.

However, in preflux processing, while the gold plating layer is provided on the suspension board terminal portions, so that the preamplifier terminal portions connected to the suspension board terminal portions get corroded by galvanic corrosion, the external terminal portions are solder connected without providing the gold plating layer, thereby not allowing the preamplifier terminal portions connected to the external terminal portions to cause galvanic corrosion.

Therefore, while the thickness of the preflux layer covering the preamplifier terminal portions connected to the suspension board terminal portions is formed thick corresponding to the portion of the corrosion in the preamplifier terminal portions connected to the suspension board terminal portions, the thickness of the preflux layer covering the preamplifier terminal portions connected to the external terminal portions is formed thinner than that of the preamplifier terminal portions connected to the suspension board terminal portions in the preamplifier terminal portions connected to the external terminal portions.

Thus, in the preamplifier terminal portions connected to the suspension board terminal portions and the preamplifier terminal portions connected to the external terminal portions, the wettability of solder with respect to the preflux layer becomes unequal. Therefore, it is impossible to stably mount the preamplifier.

It is therefore an object of the present invention to provide a wired circuit board where preflux processing is equally performed on first inner terminals and second inner terminals, thereby allowing a preamplifier to be stably mounted thereon, and a producing method thereof.

The wired circuit board of the present invention includes an insulating layer, and a first conductive pattern and a second conductive pattern formed on the insulating layer, wherein the first conductive pattern includes a first outer terminal on which a metal plating layer is provided, a first inner terminal to be solder connected and a first wire which connects the first outer terminal and the first inner terminal, the second conductive pattern includes a second outer terminal to be solder connected, a second inner terminal to be solder connected and a second wire which connects the second outer terminal and the second inner terminal, the first inner terminal and the second inner terminal are arranged in opposed relation with each other so as to be solder connected to the common electric component, preflux processing is performed thereon, and a metal plating layer is provided on the second wire.

In the wired circuit board of the present invention, it is preferable that the first outer terminal is provided for connecting a suspension board mounted with a magnetic head, the electric component is a preamplifier, the second outer terminal is provided so as to connect a control board, and the metal plating layer is a gold plating layer.

The method for producing a wired circuit board according to the present invention includes the steps of preparing an insulating layer, forming, on the insulating layer, a first conductive pattern including a first outer terminal, a first inner terminal and a first wire which connects the first outer terminal and the first inner terminal, and a second conductive pattern including a second outer terminal, a second inner terminal and a second wire which connects the second outer terminal and the second inner terminal so that the first inner terminal and the second inner terminal are arranged in opposed relation with each other so as to be solder connected to the common electric component, providing a metal plating layer on the first outer terminal and the second wire, and performing preflux processing on the first inner terminal and the second inner terminal.

According to the wired circuit board produced by using the producing method of the wired circuit board of the present invention, in the second conductive pattern, the metal plating layer is provided in the second wire.

Therefore, the second inner terminal as well as the first inner terminal gets corroded by galvanic corrosion, so that preflux processing can be equally performed on the first inner terminal and the second inner terminal.

As a result, in the first inner terminal and the second inner terminal, the wettability of solder with respect to the preflux layer can be equalized, so that the preamplifier can be stably mounted.

BRIEF DESCRIPTION OF THE DRAWINGS

FIG. 3 is a process view illustrating an embodiment of the method for producing the wired circuit board according to the present invention,
   (a) showing the step of forming an insulating base layer,
   (b) showing the step of forming a conductive pattern,
   (c) showing the step of forming an insulating cover layer,
   (d) showing the step of forming a plating layer on head-side terminals and second wires, and
   (e) showing the step of performing preflux processing on first preamplifier-side terminals, second preamplifier-side terminals, and board-side terminals; and FIG. 4 is an explanatory view illustrating a preamplifier mounting portion of the wired circuit board,
   (a) showing the wired circuit board of the present embodiment, and
   (b) showing a conventional wired circuit board.

DETAILED DESCRIPTION OF PREFERRED EMBODIMENTS

Figure 1:
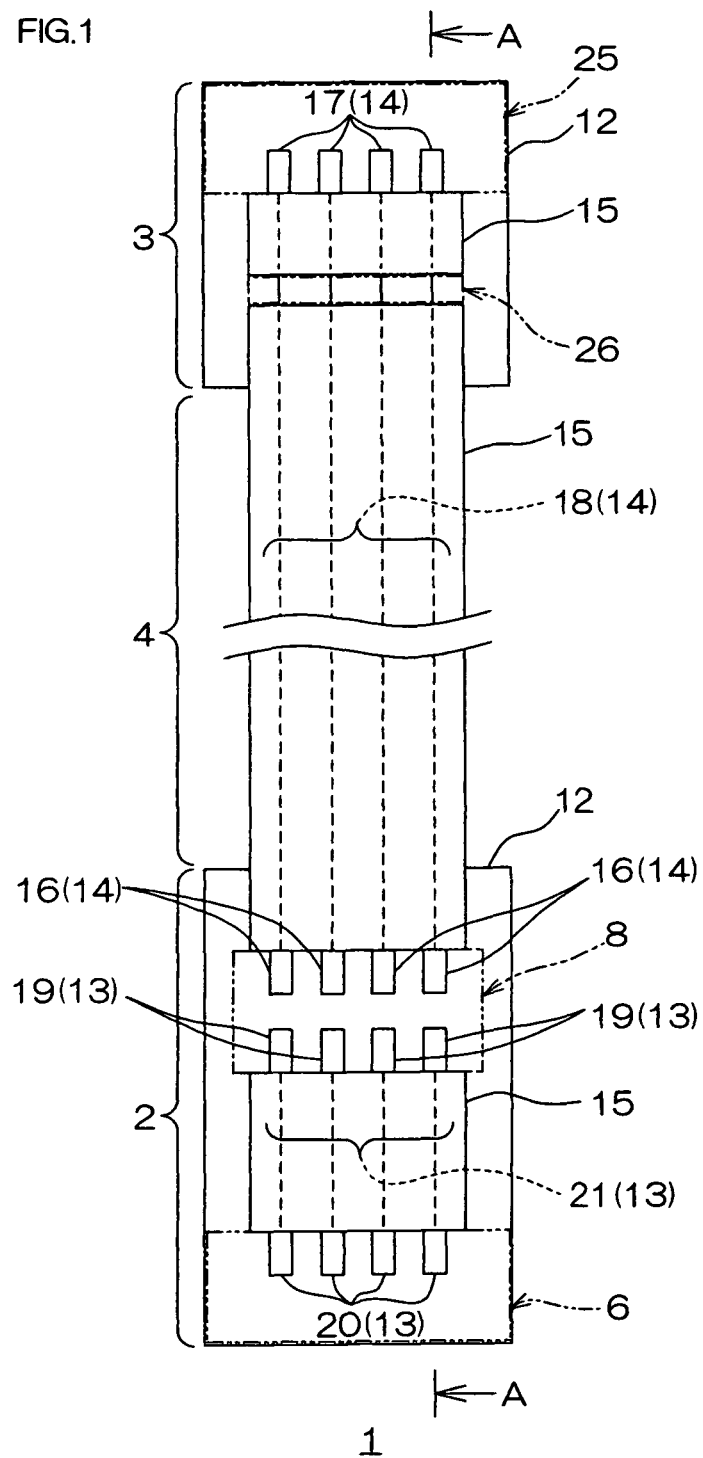
FIG. 1 is a partially omitted plan view illustrating a wired circuit board of an embodiment according to the present invention.
Figure 2:
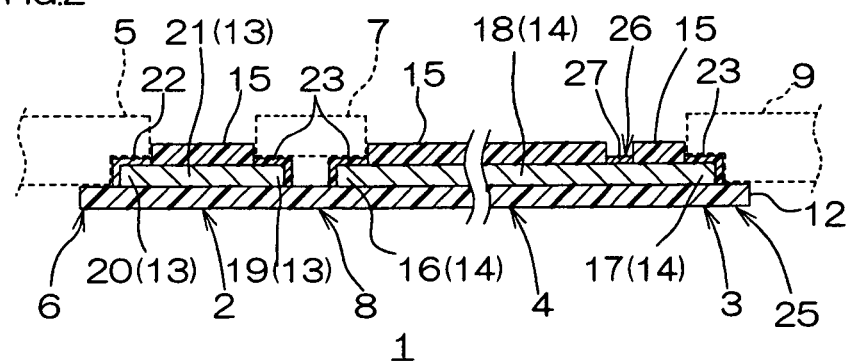
FIG. 2 is a sectional view, taken along the line A-A of the wired circuit board shown in FIG. 1.

FIG. 1 is a partially omitted plan view illustrating a wired circuit board of an embodiment according to the present invention; FIG. 2 is a sectional view, taken along the line A-A of the wired circuit board shown in FIG. 1.

As shown in FIGS. 1 and 2, a wired circuit board 1 is formed into a generally flat belt shape extending in a lengthwise direction. The wired circuit board 1 includes a preamplifier mounting portion 2 at one end portion in the lengthwise direction, a board connecting portion 3 at the other end portion in the lengthwise direction, and a wired portion 4 therebetween.

The preamplifier mounting portion 2 is formed into a generally rectangular shape in plane view. In the preamplifier mounting portion 2, a connecting region of the suspension board with circuit 6 where a suspension board with circuit 5 (shown in phantom lines in FIG. 2) as a suspension board mounted with a magnetic head (not shown) to be connected is defined in a generally rectangular shape extending in the widthwise direction perpendicular to the lengthwise direction at one end portion in the lengthwise direction and a preamplifier mounting region 8 where a preamplifier 7 (shown in phantom lines in FIG. 2) is to be mounted is defined in a generally rectangular shape extending in the widthwise direction at spaced intervals with respect to the connecting region of the suspension board with circuit 6 in the lengthwise direction at the other end portion in the lengthwise direction.

The board connecting portion 3 is formed into a generally rectangular shape in plane view. In the board connecting portion 3, a connecting region of the control board 25 to be connected to a control board 9 (shown in phantom lines in FIG. 2) for controlling a magnetic head of the suspension board with circuit 5 (not shown) is defined in a generally rectangular shape extending in the widthwise direction at the other end portion in the lengthwise direction and a dummy plating forming region 26 for forming a dummy plating layer 27 (described later) on second wires 18 (described later) is defined in a generally rectangular shape extending in the widthwise direction at spaced intervals with respect to the connecting region of the control board 25 in the lengthwise direction at one end portion in the lengthwise direction.

As shown in FIG. 2, the wired circuit board 1 includes an insulating base layer 12, a first conductive pattern 13 and a second conductive pattern 14 formed on the insulating base layer 12, and an insulating cover layer 15 formed on the insulating base layer 12 so as to cover the first conductive pattern 13 and the second conductive pattern 14.

The insulating base layer 12 is formed in a shape corresponding to the outer shape of the wired circuit board 1. Specifically, the insulating base layer 12 expands in the widthwise direction at the preamplifier mounting portion 2 and the board connecting portion 3 and is formed to have a narrow width in the widthwise direction at the wired portion 4.

The first conductive pattern 13 is formed in the preamplifier mounting portion 2, extends along the lengthwise direction of the wired circuit board 1, and integrally includes a plurality (four pieces) of suspension-side terminals 20 as the first outer terminal connected to the suspension board with circuit 5, a plurality (four pieces) of first preamplifier-side terminals 19 as the first inner terminal connected to the preamplifier 7 as an electric component, and a plurality (four pieces) of first wires 21 which connect each of the first preamplifier-side terminals 19 to the respective corresponding suspension-side terminals 20.

The suspension-side terminals 20 each are formed into a generally rectangular shape in plane view (square land shape) and are arranged in parallel at spaced intervals to each other in the widthwise direction at the other end portion of the lengthwise direction in the connecting region of the suspension board with circuit 6.

The first preamplifier-side terminals 19 each are formed into a generally rectangular shape in plane view (square land shape) and are arranged in parallel at spaced intervals to each other in the widthwise direction at one end portion of the lengthwise direction in the preamplifier mounting region 8.

The first wires 21 each extend in the lengthwise direction so as to connect each of the suspension-side terminals 20 and each of the first preamplifier-side terminals 19, and are arranged in parallel at spaced intervals to each other in the widthwise direction.

The second conductive pattern 14 is formed over the preamplifier mounting portion 2, the wired portion 4, and the board connecting portion 3 so as to extend along the lengthwise direction of the wired circuit board 1, arranged in spaced relation to the first conductive pattern 13 at the other end side in the lengthwise direction, and integrally including a plurality (four pieces) of board-side terminals 17 as the second outer terminal connected to the control board 9, a plurality (four pieces) of second preamplifier-side terminals 16 as the second inner terminal connected to the preamplifier 7, and a plurality (four pieces) of the second wires 18 which connect each of the second preamplifier-side terminals 16 to the respective corresponding board-side terminals 17.

The board-side terminals 17 each are formed into a generally rectangular shape in plane view (square land shape) and are arranged in parallel at spaced intervals to each other in the widthwise direction at one end portion of the lengthwise direction in the connecting region of the control board 25.

The second preamplifier-side terminals 16 each are formed into a generally rectangular shape in plane view (square land shape) and are arranged in parallel at spaced intervals to each other in the widthwise direction at the other end portion of the lengthwise direction in the preamplifier mounting region 8. The second preamplifier-side terminals 16 each are arranged in opposed relation to the first preamplifier-side terminals 19 each with a shorter lengthwise spacing than the lengthwise length of the preamplifier 7 so as to correspond to the first preamplifier-side terminals 19 each.

The second wires 18 each extend in the lengthwise direction so as to connect each of the board-side terminals 17 and each of the second preamplifier-side terminals 16 and are arranged in parallel at spaced intervals to each other in the widthwise direction.

The insulating cover layer 15 is formed on the insulating base layer 12 so as to expose each of the suspension-side terminals 20, each of the first preamplifier-side terminals 19, each of the second preamplifier-side terminals 16, and each of the board-side terminals 17, to expose each of the second wires 18 in the dummy plating forming region 26, and to cover each of the second wires 18 other than those in the dummy plating forming region 26 and each of the first wires 21.

In the wired circuit board 1, a metal plating layer 22 is formed so as to cover each of the suspension-side terminals 20 and a preflux layer 23 is formed so as to cover each of the first preamplifier-side terminals 19 at the first conductive pattern 13.

Further, the dummy plating layer 27 is formed so as to cover each of the second wires 18 in the dummy plating forming region 26 and the preflux layer 23 is formed so as to cover each of the board-side terminals 17 at the second conductive pattern 14.

In the wired circuit board 1, terminals of the suspension board with circuit 5 (not shown) are connected to each of the suspension-side terminals 20, terminals of the preamplifier 7 (not shown) being solder connected to the first preamplifier-side terminals 19 and the second preamplifier-side terminals 16 so that the preamplifier 7 can extend over the first preamplifier-side terminals 19 and the second preamplifier-side terminals 16, and terminals of the control board 9 (not shown) being solder connected to each of the board-side terminals 17.

FIG. 3 is a process view illustrating an embodiment of the method for producing the wired circuit board according to the present invention.

Next, a method for producing the wired circuit board 1 is described with reference to FIG. 3.

First, in this method, an insulating base layer 12, a first conductive pattern 13 and a second conductive pattern 14, and an insulating cover layer 15 are sequentially formed.

Specifically, in this method, as shown in FIG. 3 (a), the insulating base layer 12 is prepared.

As an insulating material for forming the insulating base layer 12, for example, synthetic resin such as polyimide, polyether nitrile, polyether sulfone, polyethylene terephthalate, polyethylene naphthalate, polyvinyl chloride is used. Of these, polyimide is preferably used and a photosensitive synthetic resin is also used.

The insulating base layer 12 is formed, for example, by preliminarily forming a synthetic resin into a film having the above-mentioned pattern.

As an alternative, the insulating base layer 12 can be formed in the following manner. For example, a solution of photosensitive synthetic resin is applied to the surface of the supporting board (not shown) and is then dried. Thereafter, the dried resin is exposed to light with a pattern where the insulating base layer 12 is formed and is then developed to be hot cured as required.

The insulating base layer 12 has a thickness in the range of, for example, 1 to 20 μm, or preferably 8 to 15 μm.

Next, in this method, as shown in FIG. 3 (b), the first conductive pattern 13 and the second conductive pattern 14 are formed on the insulating base layer 12.

As a conductive material for forming the conductive pattern 13, for example, copper, nickel, gold, tin, solder, or alloys thereof is used. Of these, copper is preferably used.

To form the conductive pattern 13, a known patterning method such as a subtractive method or an additive method is used.

In the subtractive method, a conductive layer made of the above-mentioned conductive material is first laminated on the entire surface of the insulating base layer 12 via an adhesive layer as required. Then, an etching resist having the same pattern as the first conductive pattern 13 and the second conductive pattern 14 is formed on the conductive layer. The conductive layer is etched using the etching resist as a resist. Thereafter, the etching resist is removed.

To form the first conductive pattern 13 and the second conductive pattern 14 using the subtractive method, as described above, a conductive layer can be laminated on the insulating base layer 12. However, as an alternative, the first conductive pattern 13 and the second conductive pattern 14 can be formed in the following manner. After obtaining a commercially available two-layer substrate where the insulating base layer 12 and a conductive layer are preliminarily laminated, the conductive layer is etched as described above.

Further, in the additive method, a conductive seed film is first formed on the surface of the metal supporting board 11 including the insulating base layer 12 by a sputtering process or the like. Then, a plating resist is formed on the surface of the conductive seed film in a pattern reverse to the conductive pattern 13. Subsequently, the conductive pattern 13 is formed on the surface of the conductive seed film on the insulating base layer 12 exposed from the plating resist by electrolytic plating. Thereafter, the plating resist and the conductive seed film where the plating resist is laminated are removed.

The first conductive pattern 13 and the second conductive pattern 14 have a thickness in the range of, for example, 3 to 50 μm, or preferably 5 to 25 μm.

In the first conductive pattern 13, the first preamplifier-side terminal 19 has a width in the range of, for example, 10 to 10000 μm, or preferably 10 to 2000 μm, and a spacing between each of the first preamplifier-side terminals 19 is in the range of, for example, 10 to 10000 μm, or preferably 10 to 2000 μm. The suspension-side terminal 20 has a width in the range of, for example, 10 to 10000 μm, or preferably 10 to 2000 μm, and a spacing between each of the suspension-side terminals 20 is in the range of, for example, 10 to 10000 μm, or preferably 10 to 2000 μm. The first wire 21 has a width in the range of, for example, 10 to 10000 μm, or preferably 10 to 2000 μm, and a spacing between each of the first wires 21 is in the range of, for example, 10 to 10000 μm, or preferably 10 to 2000 μm.

In the second conductive pattern 14, the second preamplifier-side terminal 16 has a width in the range of, for example, 10 to 10000 μm, or preferably 10 to 2000 μm, and a spacing between each of the second preamplifier-side terminals 16 is in the range of, for example, 10 to 10000 μm, or preferably 10 to 2000 μm. The board-side terminal 17 has a width in the range of, for example, 10 to 10000 μm, or preferably 10 to 2000 μm, and a spacing between each of the board-side terminals 17 is in the range of, for example, 10 to 10000 μm, or preferably 10 to 2000 μm. The second wire 18 has a width in the range of, for example, 10 to 10000 μm, or preferably 10 to 2000 μm, and a spacing between each of the second wires 18 is in the range of, for example, 10 to 10000 μm, or preferably 10 to 2000 μm.

Next, in this method, as shown in FIG. 3 (c), the insulating cover layer 15 is formed on the insulating base layer 12 so as to cover the first conductive pattern 13 and the second conductive pattern 14. An insulating material for forming the insulating cover layer 15 includes the same insulating material as that for the insulating base layer 12.

The insulating cover layer 15 is formed, for example, by preliminarily forming a synthetic resin into a film having the above-mentioned pattern, and adhesively bonding the film to the surface of the insulating base layer 12 including the first conductive pattern 13 and the second conductive pattern 14 with thermo-compression bonding or via a known adhesive layer.

As an alternative, the insulating cover layer 15 can be formed in the following manner. For example, a solution of photosensitive synthetic resin is applied to the surface of the insulating base layer 12 including the first conductive pattern 13 and the second conductive pattern 14 and is then dried. Thereafter, the dried resin is exposed to light with the above-mentioned pattern and is then developed to be hot cured as required.

The insulating cover layer 15 has a thickness in the range of, for example, 2 to 50 µm, or preferably 3 to 25 µm.

The lengthwise length of the second wires 18 exposed from the insulating cover layer 15 in the dummy plating forming region 26 is substantially the same as that of the suspension-side terminals 20 so that the area of the exposed second wires 18 is preferably substantially the same as that of the suspension-side terminals 20.

Next, in this method, as shown in FIG. 3 (d), after masking the first preamplifier-side terminals 19, the second preamplifier-side terminals 16, and the board-side terminals 17 by using plating resist made of tape-masking or the like, the surfaces of the suspension-side terminals 20 and the second wires 18 in the dummy plating forming region 26 are plated to form the metal plating layer 22 thereon. Thereafter, the plating resist is removed.

A metal used in plating is not particularly limited, and for example, gold, platinum, silver, tin, rhodium is used. Of these, gold is preferably used.

As an alternative, the metal plating layer 22 can be formed in multilayers by using different metals from one another.

The metal plating layer 22 has a thickness in the range of, for example, 0.01 to 5.0 µm, or preferably 0.1 to 1 µm.

Next, in this method, as shown in FIG. 3 (e), after removing the oxide films formed on the surfaces of the first preamplifier-side terminals 19, the second preamplifier-side terminals 16, and the board-side terminals 17 by chemical micro-etching, preflux processing is performed on the first preamplifier-side terminals 19, the second preamplifier-side terminals 16, and the board-side terminals 17.

As a preflux used in preflux processing, for example, an aqueous preflux including benzotriazole compound and/or benzimidazole compound are/is used. In the case where the preflux is an aqueous preflux, the preflux layer 23 can be selectively formed on the first preamplifier-side terminals 19, the second preamplifier-side terminals 16 and the board-side terminals 17 when the wired circuit board 1 is dipped in an aqueous solution of aqueous preflux.

The preflux layer 23 thus formed has a thickness in the range of, for example, 0.05 to 3 µm, or preferably 0.1 to 0.5 µm.

In the case where the thickness of the preflux layer 23 formed on the first preamplifier-side terminals 19 is 100%, that formed on the second preamplifier-side terminals 16 is in the range of, for example, 50 to 200%, or preferably 80 to 120%.

Thus, the wired circuit board 1 is produced.

FIG. 4 is an explanatory view illustrating a preamplifier mounting portion of the wired circuit board, (a) showing the wired circuit board of the present embodiment, and (b) showing a conventional wired circuit board.

Conventionally, in the wired circuit board, the metal plating layer 22 has been provided on the suspension-side terminals 20 to which the first preamplifier-side terminals 19 are electrically connected.

On the other hand, the board-side terminals 17 to which the second preamplifier-side terminals 16 are electrically connected are solder connected to the terminals of the control board 9, so that the metal plating layer 22 is not provided thereon, and preflux processing is performed on the first preamplifier-side terminals 19, the second preamplifier-side terminals 16, and the board-side terminals 17 which are solder connected.

In the preflux processing, the first preamplifier-side terminals 19 are electrically connected to the metal plating layer 22 of the suspension-side terminals 20, so that they get corroded by galvanic corrosion.

On the other hand, the metal plating layer 22 is not provided on the board-side terminals 17, so that the second preamplifier-side terminals 16 don't get corroded by galvanic corrosion.

Therefore, as shown in FIG. 4 (b), in the first preamplifier-side terminals 19, the thickness of the preflux layer 23 covering the first preamplifier-side terminals 19 is formed thick.

On the other hand, in the second preamplifier-side terminals 16, the thickness of the preflux layer 23 covering the second preamplifier-side terminals 16 is formed thinner than that of the first preamplifier-side terminals 19.

Thus, in the first preamplifier-side terminals 19 and the second preamplifier-side terminals 16, the wettability of solder with respect to the preflux layer 23 becomes unequal.

Therefore, it is impossible to stably mount the preamplifier 7 on the first preamplifier-side terminals 19 and the second preamplifier-side terminals 16.

Meanwhile, according to the wired circuit board 1, as shown in FIG. 2, the metal plating layer 22 is provided on the second conductive pattern 14 in the second wires 18.

Therefore, the second preamplifier-side terminals 16 as well as the first preamplifier-side terminals 19 get corroded by galvanic corrosion, and as shown in FIG. 4 (a), preflux processing can be equally (substantially the equal thickness) performed on the first preamplifier-side terminals 19 and the second preamplifier-side terminals 16.

As a result, after performing preflux processing, the first preamplifier-side terminals 19 and the second preamplifier-side terminals 16 can be formed to have an equal thickness, and the wettability of the first preamplifier-side terminals 19 and the second preamplifier-side terminals 16 can be equalized, so that the preamplifier 7 can be stably mounted.

EXAMPLE

The present invention is described more specifically by showing an example herein below. However, the present invention is by no means limited to the example.

Example

First, a two-layer substrate made by laminating a conductive layer having a thickness of 18 µm on an insulating base layer made of polyimide having a thickness of 12.5 µm via an adhesive layer having a thickness of 10 µm was prepared.

Next, an etching resist having the same pattern as a first conductive pattern and a second conductive pattern was formed on the conductive layer. The conductive layer was etched using the etching resist as a resist. Thereafter, the etching resist was removed (cf. FIG. 3 (b)).

Thus, four pieces each of first preamplifier-side terminals and second preamplifier-side terminals both having a widthwise length of 85 μm were formed to be arranged in parallel with a spacing of 90 μm to each other in the widthwise direction.

The lengthwise spacing between the first preamplifier-side terminals and the second preamplifier-side terminals was 1.5 mm.

Four pieces of suspension-side terminals having a widthwise length of 200 μm were formed to be arranged in parallel with a spacing of 90 μm to each other in the widthwise direction.

Four pieces of board-side terminals having a widthwise length of 600 μm were formed to be arranged in parallel with a spacing of 600 μm to each other in the widthwise direction.

Four pieces of first wires having a widthwise length of 80 μm were formed to be arranged in parallel with a spacing of 200 μm to each other in the widthwise direction.

Four pieces of second wires having a widthwise length of 150 μm were formed to be arranged in parallel with a spacing of 80 μm to each other in the widthwise direction.

Next, a polyimide film formed in the above-mentioned pattern having a thickness of 12.5 μm was adhesively bonded on the surface of an insulating base layer including the first conductive pattern and the second conductive pattern via a known adhesive layer so as to expose each of the suspension-side terminals, each of the first preamplifier-side terminals, each of the second preamplifier-side terminals and each of the board-side terminals, to expose each of the second wires in a dummy plating forming region, and to cover each of the second wires other than those in the dummy plating forming region and each of the first wires, and then the adhesive was heated at 150° C. for one hour to be cured, whereby an insulating cover layer was formed (cf. FIG. 3 (c)).

Next, after masking the first preamplifier-side terminals, the second preamplifier-side terminals, and the board-side terminals by tape-masking, the surfaces of the suspension-side terminals and the second wires exposed from the insulating cover layer were electrolytically plated with gold to form a gold plating layer having a thickness of 0.5 μm (cf. FIG. 3 (d)). Thereafter, the tape-masking was removed.

Next, after removing the oxide films formed on the surfaces of the first preamplifier-side terminals, the second preamplifier-side terminals, and the board-side terminals by chemical micro-etching, by dipping in an aqueous solution of aqueous preflux including benzimidazole compound (preflux processing), the preflux layer was formed on the surfaces of the first preamplifier-side terminals, the second preamplifier-side terminals, and the board-side terminals (cf. FIG. 3 (e)). Thus, a wired circuit board was obtained.

The preflux layer formed on the surface of the first preamplifier-side terminals has a thickness of 0.38 μm, and that of the second preamplifier-side terminals has a thickness of 0.37 μm.

While the illustrative embodiments of the present invention are provided in the above description, such is for illustrative purpose only and it is not to be construed limiting the scope of the present invention. Modification and variation of the present invention that will be obvious to those skilled in the art is to be covered by the following claims.

What is claimed is:

1. A wired circuit board comprising:
   an insulating layer; and
   a first conductive pattern and a second conductive pattern formed on the insulating layer; wherein
   the first conductive pattern includes a first outer terminal on which a metal plating layer is provided, a first inner terminal to be solder connected, and a first wire which connects the first outer terminal and the first inner terminal;
   the second conductive pattern includes a second outer terminal to be solder connected, a second inner terminal to be solder connected, and a second wire which connects the second outer terminal and the second inner terminal;
   a metal plating layer is disposed only on the first outer terminal and the second wire;
   the first inner terminal and the second inner terminal are arranged in opposed relation with each other so as to be solder connected to a common electric component and preflux processing is performed only on the first inner terminal, the second inner terminal, and the second outer terminal; and
   a dummy plating forming region is defined between the second outer terminal and the second inner terminal in the second wire, the metal plating layer being provided on the second wire in the dummy plating forming region.

2. The wired circuit board according to claim 1, wherein the first outer terminal is provided for connecting a suspension board mounted with a magnetic head;
   the electric component is a preamplifier;
   the second outer terminal is provided for connecting a control board; and
   the metal plating layer is a gold plating layer.

3. A method of producing a wired circuit board, comprising the steps of:
   preparing an insulating layer;
   forming, on the insulating layer,
      a first conductive pattern including a first outer terminal, a first inner terminal and a first wire which connects the first outer terminal and the first inner terminal, and
      a second conductive pattern including a second outer terminal, a second inner terminal, and a second wire which connects the second outer terminal and the second inner terminal,
      so that the first inner terminal and the second inner terminal are arranged in opposed relation with each other so as to be solder connected to a common electric component;
   providing a metal plating layer only on the first outer terminal and the second wire; and
   performing preflux processing only on the first inner terminal, the second inner terminal, and the second outer terminal,
   wherein the metal plating layer providing step includes providing the metal plating layer in a dummy plating forming region defined between the second outer terminal and the second inner terminal in the second wire.

4. The wired circuit board according to claim 1, wherein an insulating cover layer which covers the second wire is formed on the insulating layer, and the dummy plating forming region is defined by opening the insulating cover layer.

5. The method of producing a wired circuit board according to claim 3, further comprising the step of forming, on the insulating layer, an insulating cover layer which covers the second wire, the insulating cover layer forming step including defining the dummy plating forming region by opening the insulating cover layer.

6. The wired circuit board according to claim 1, wherein the metal plating layer is disposed on the first outer terminal and in the dummy plating region at the same time.

7. The method of producing a wired circuit board according to claim 3, wherein, in the metal layer providing step, further comprising forming the metal plating layer on the first outer terminal and in the dummy plating region at the same time.

8. The wired circuit board according to claim 4, wherein a lengthwise length of the second wire exposed from the opening in the insulating cover layer in the dummy plating forming region is substantially the same as that of the first outer terminal, so that the area of the exposed second wire in the dummy plating forming region is substantially the same as that of the first outer terminal.

9. The method of producing a wired circuit board according to claim 5, wherein a lengthwise length of the second wire exposed from the opening in the insulating cover layer in the dummy plating forming region is substantially the same as that of the first outer terminal, so that the area of the exposed second wire in the dummy plating forming region is substantially the same as that of the first outer terminal.

\* \* \* \* \*